(12) United States Patent
Kim

(10) Patent No.: US 11,264,523 B2
(45) Date of Patent: Mar. 1, 2022

(54) SOLAR CELL MODULE

(71) Applicant: LG ELECTRONICS INC., Seoul (KR)

(72) Inventor: Jinsung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 8 days.

(21) Appl. No.: 16/677,211

(22) Filed: Nov. 7, 2019

(65) Prior Publication Data

US 2020/0144434 A1 May 7, 2020

(30) Foreign Application Priority Data

Nov. 7, 2018 (KR) .................. 10-2018-0136201

(51) Int. Cl.
*H01L 31/042* (2014.01)
*H02N 6/00* (2006.01)
*H01L 31/05* (2014.01)
*H01L 31/049* (2014.01)
*H01L 31/02* (2006.01)

(52) U.S. Cl.
CPC ...... *H01L 31/0512* (2013.01); *H01L 31/0201* (2013.01); *H01L 31/049* (2014.12)

(58) Field of Classification Search
CPC .. H01L 31/05; H01L 31/0504; H01L 31/0512
See application file for complete search history.

(56) References Cited

U.S. PATENT DOCUMENTS

| 4,574,160 | A | * | 3/1986 | Cull | .................. | H01L 31/0508 136/245 |
| 2009/0255565 | A1 | * | 10/2009 | Britt | .................. | H01L 31/0512 136/244 |
| 2011/0265844 | A1 | * | 11/2011 | Storbeck | ............ | H01L 31/0504 136/244 |
| 2011/0308591 | A1 | * | 12/2011 | Yamazaki | ......... | H01L 31/02168 136/255 |
| 2014/0109962 | A1 | * | 4/2014 | Kobayashi | ......... | B23K 35/0244 136/256 |
| 2015/0270410 | A1 | | 9/2015 | Heng et al. | | |

FOREIGN PATENT DOCUMENTS

| KR | 10-2016-0050659 A | 5/2016 |
| KR | 10-2017-0043102 A | 4/2017 |
| KR | 10-2017-0055945 A | 5/2017 |
| KR | 10-1823605 B1 | 3/2018 |

* cited by examiner

*Primary Examiner* — Angelo Trivisonno
(74) *Attorney, Agent, or Firm* — Birch, Stewart, Kolasch & Birch, LLP

(57) ABSTRACT

Discuss is a solar cell module including a plurality of solar cells having a long axis and a short axis, each solar cell including a first electrode disposed on a front surface and a second electrode disposed on a back surface thereof, and the plurality of solar cells being disposed along a first direction, and a plurality of wiring members connected to the first electrode of a first solar cell and the second electrode of a second solar cell adjacent to the first solar cell among the plurality of solar cells, wherein a thickness of the plurality of wiring members is approximately 270 μm to 320 μm.

6 Claims, 9 Drawing Sheets

(A)

(B)

SOLAR CELL MODULE

CROSS-REFERENCE TO RELATED APPLICATION

This application claims priority to and the benefit of Korean Patent Application No. 10-2018-0136201 filed in the Korean Intellectual Property Office on Nov. 7, 2018, the entire contents of which are incorporated herein by reference.

BACKGROUND OF THE INVENTION

Field of the Invention

The present disclosure relates to a solar cell module in which a plurality of solar cells are connected by a wiring member.

Description of the Related Art

A plurality of solar cells are connected in series or in parallel by ribbons, and are manufactured in a form of solar cell panels by a packaging process for protecting the plurality of solar cells.

Various methods can be used to connect the solar cells, for example, it is possible to connect the solar cells using a ribbon having a large width of about 1.5 mm. However, since losses of light can occur due to the large width of the ribbon, the number of ribbons disposed in the solar cell should be reduced. Then, moving distances of carriers increase, so that the electrical characteristics cannot be excellent.

Therefore, a structure of increasing the number of wiring members and reducing the moving distances of the carriers by using the wiring members having a width smaller than the ribbon instead of the ribbon has been proposed.

By the way, since the wiring member is made of metal, it is not easily bent or warped, when two neighboring solar cells are connected with a plurality of wiring members, a distance between the two neighboring solar cells can be widened. Thus, there is a problem that the overall appearance size of the solar cell module increases.

On the other hand, a new type of solar cell module has been proposed in which a solar cell (hereinafter referred to as a mother solar cell) produced in a standard size is divided into a plurality of solar cells to form a solar cell module.

By the way, a solar cell module configured by using the divided solar cells has a problem that the total size of the solar cell panel increases, because the number of divided solar cells used is multiple as many as the solar cell module made using the mother solar cell.

As the size of the solar cell panel increases in this way, because it is difficult for producers of the solar cells to use the existing equipment, that is, the existing production equipment installed to fit the solar cell panels made of the mother solar cells, and thus new production equipment must be installed, there is a problem that the price competitiveness of the product is lowered due to the excessive production cost of the product.

Therefore, even when manufacturing the solar cell panel by connecting the divided solar cells with the plurality of wiring members, there is a need for a technology that can be used as it is without changing the existing equipment.

SUMMARY OF THE INVENTION

The present disclosure has been made in view of the above technical background, when connecting divided solar cells with a plurality of wiring members, it is to prevent the size of the solar panel from increasing by reducing a distance between the two neighboring solar cells than before.

A solar cell module according to an embodiment of the present disclosure includes a plurality of solar cells each having a long axis and a short axis, and including a first electrode disposed on a front surface and a second electrode disposed on a back surface thereof, and the plurality of solar cells being disposed along a first direction, and a plurality of wiring members connected to the first electrode of a first solar cell and the second electrode of a second solar cell adjacent to the first solar cell among the plurality of solar cells, wherein the plurality of wiring members include a core layer of metal, and a solder layer which surrounds a surface of the core layer and is formed of a solder material, and a ratio D2/D1 of a thickness D2 of the solder layer to a thickness D1 of the core layer is approximately 0.05<D2/D1<0.08.

A thickness of the plurality of wiring members can be 270 µm to 320 µm or approximately thereabout, for example the thickness of the core layer can be 240 to 280 µm or approximately thereabout, for example 255 to 265 µm or approximately thereabout, and the thickness of the solder layer can be 15 µm to 20 µm or approximately thereabout.

A cross section of each wiring member can have a polyhedral shape having at least a curved surface or at least three vertices.

Preferably, a number of the plurality of wiring members can be 6 to 24, for example the number of the plurality of wiring members can be 8 to 12, and a distance between the first solar cell and the second solar cell can be 0.5 mm to 1.5 mm, for example can be 1 mm.

Preferably, the short axis can be a half of the long axis.

Each of the plurality of solar cells can include a first side in the first direction and a second side opposite to the first side having a surface roughness rougher than the first side.

Each of the plurality of solar cells can include a first side and a second side opposite to the first side having a surface roughness rougher than the first side.

According to an embodiment of the present disclosure, when composing a module using divided solar cells, the present disclosure prevents the size of the module from increasing by reducing the distance between the solar cells, in addition, the present disclosure prevents the output of the solar cell module from decreasing by optimizing the thickness of the wiring member to match the reduced distance.

DETAILED DESCRIPTION OF THE EMBODIMENTS

Figure 1:
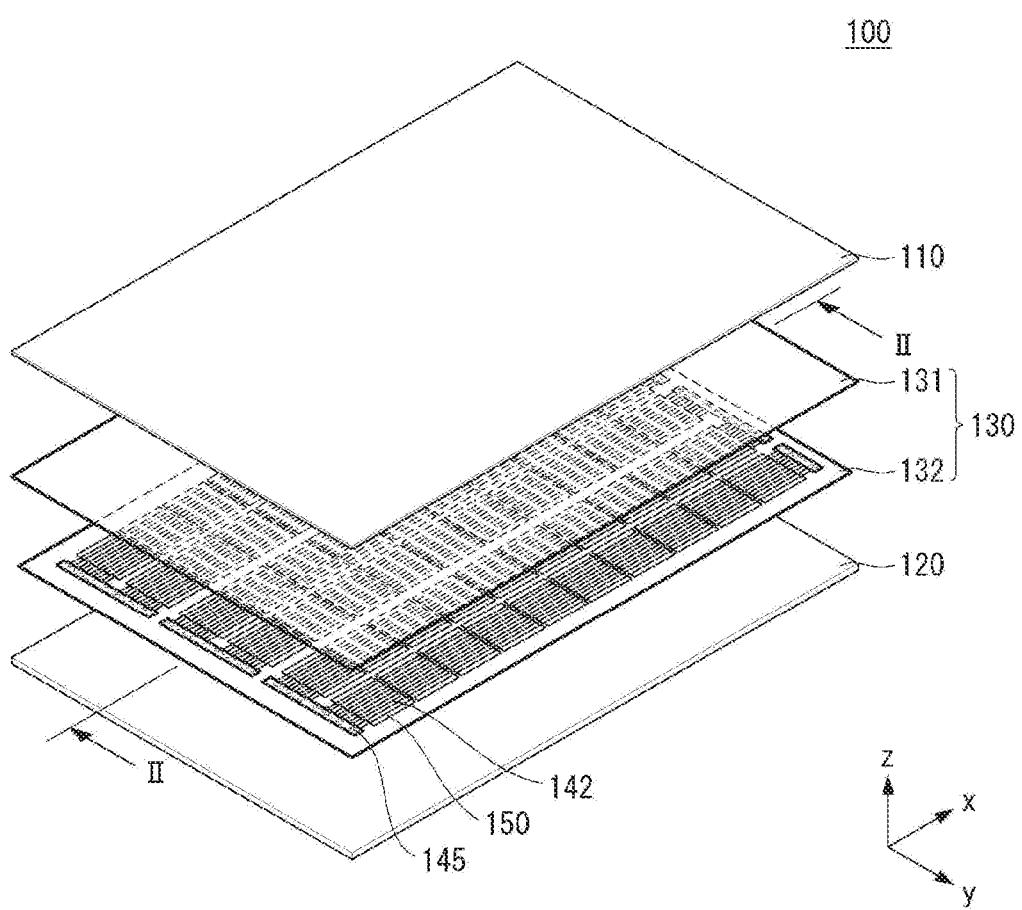
FIG. 1 is a perspective view illustrating a solar cell panel according to an embodiment of the present disclosure.

Hereinafter, embodiments of the present disclosure will be described in detail with reference to the accompanying drawings. However, it is needless to say that the present disclosure is not limited to these embodiments and can be modified into various forms.

In the drawings, illustration of the parts not related to the description is omitted in order to clarify and briefly describe the present disclosure, and the same reference numerals are used for the same or very similar parts throughout the specification. In the drawings, the thickness, width, and the like are enlarged or reduced to make the explanation more clear, and the thickness, width, etc. of the present disclosure are not limited to those shown in the drawings.

When a part is referred to as "including" another part throughout the specification, it does not exclude other parts and can further include other parts unless specifically stated otherwise. Further, when a part of a layer, a film, a region, a plate, or the like is referred to as being "on" other part, this includes not only the case where it is "directly on" the other part but also the case where the other part is positioned in the middle. When the part of the layer, the film, the region, the plate, or the like is referred to as being "directly on" the other part, it means that no other part is positioned in the middle.

Hereinafter, a solar cell and a solar cell panel including the solar cell according to an embodiment of the present disclosure will be described in detail with reference to the accompanying drawings. In the following, the expressions "first", "second", "third", etc. are used only to distinguish each other, but the present disclosure is not limited thereto.

Figure 2:
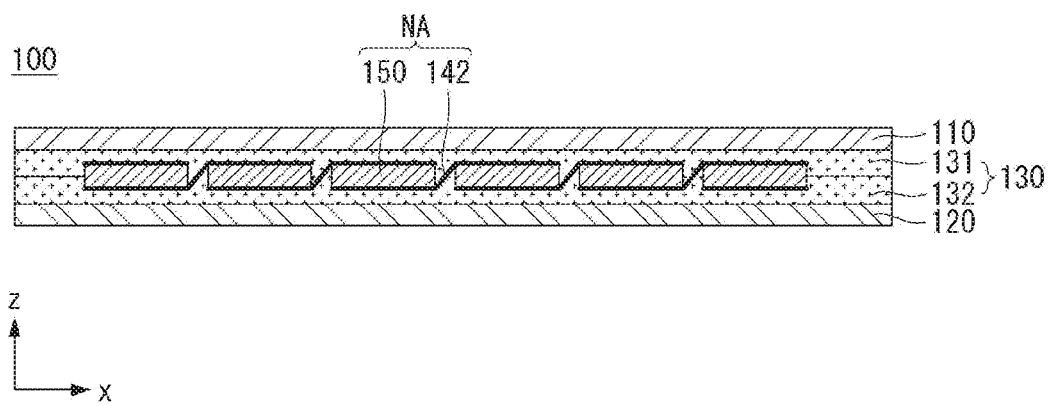
FIG. 2 is a cross-sectional view taken along a line II-II in FIG. 1.

FIG. 1 is a perspective view illustrating a solar cell panel according to an embodiment of the present disclosure, and FIG. 2 is a cross-sectional view taken along a line II-II in FIG. 1. All the components of the solar cell panel according to all embodiments of the present disclosure are operatively coupled and configured.

Referring to FIGS. 1 and 2, a solar cell panel 100 according to the present embodiment includes a plurality of solar cells 150 and a wiring member (or a wire, an interconnector, etc.) 142 for electrically connecting the plurality of solar cells 150 that form a string NA. The solar cell panel 100 includes a sealing member 130 that surrounds and seals a solar cell module (MA) including the plurality of solar cells 150 and the wiring member (or interconnector) 142 connecting them, a first cover member 110 positioned on a front surface of the solar cell 150 on the sealing member 130, and a second cover member 120 positioned on a back surface of the solar cell 150 on the sealing member 130. This will be explained in more detail.

First, the solar cell 150 can include a photoelectric conversion unit that converts the solar cell into electric energy, and an electrode that is electrically connected to the photoelectric conversion unit to collects and transfers a current. The plurality of solar cells 150 can be electrically connected in series, parallel, or series-parallel by the wiring member 142. Specifically, the wiring member 142 electrically connects two neighboring solar cells 150 among the plurality of solar cells 150.

A bus ribbon 145 electrically connects two neighboring strings among a plurality of strings that are bundles of solar cells connected by the wiring member 142. The wiring member is connected to one end of the string, and the bus ribbon 145 can electrically connect two adjacent strings by connecting the wiring member connected to one end of the string. The bus ribbon 145 can be disposed in the direction crossing the string at the end of the string. The bus ribbon 145 can connect strings adjacent to each other or to a junction box that prevents reverse flow of current in the string or strings. The material, shape, connection structure, etc. of the bus ribbon 145 can be variously modified, and the present disclosure is not limited thereto.

The sealing member 130 can include a first sealing member 131 positioned on the front surface of the solar cell 150 connected by the wiring member 142, and a second sealing member 132 positioned on the back surface of the solar cell 150. The first sealing member 131 and the second sealing member 132 prevent moisture and oxygen from entering and chemically bind each element of the solar cell panel 100. The first and second sealing members 131 and 132 can be made of an insulating material having transparency and adhesiveness. For example, an ethylene-vinyl acetate copolymer resin (EVA), a polyvinyl butyral, a silicon resin, an ester-based resin, an olefin-based resin, or the like can be used for the first sealing member 131 and the second sealing member 132. The second cover member 120, the second sealing member 132, the solar cell 150, the first sealing member 131, and the first cover member 110 are integrated to form the solar cell panel 100 by a lamination process or the like using the first and second sealing members 131 and 132.

The first cover member 110 is positioned on the first sealing member 131 to constitute the front surface of the solar cell panel 100, and the second cover member 120 is positioned on the second sealing member 132 to constitute the back surface of the solar cell panel 100. The first cover member 110 and the second cover member 120 can be made of an insulating material capable of protecting the solar cell 150 from external shock, moisture, ultraviolet rays, or the like. The first cover member 110 can be made of a light penetrating material capable of penetrating light, and the second cover member 120 can be made of a sheet composed of a light penetrating material, a non-light penetrating material, or a reflective material. For example, the first cover member 110 can be composed of a glass substrate or the like, and the second cover member 120 can have a TPT (Tedlar/PET/Tedlar) type, or include a polyvinylidene fluoride (PVDF) resin layer formed on at least one surface of a base film (for example, polyethylene terephthalate (PET)).

However, the present disclosure is not limited thereto. Accordingly, the first and second sealing members 131 and 132, the first cover member 110, or the second cover member 120 can include various materials other than those described above, and can have various shapes. For example, the first cover member 110 or the second cover member 120 can have various shapes (for example, a substrate, a film, a sheet, etc.) or materials.

Figure 3:
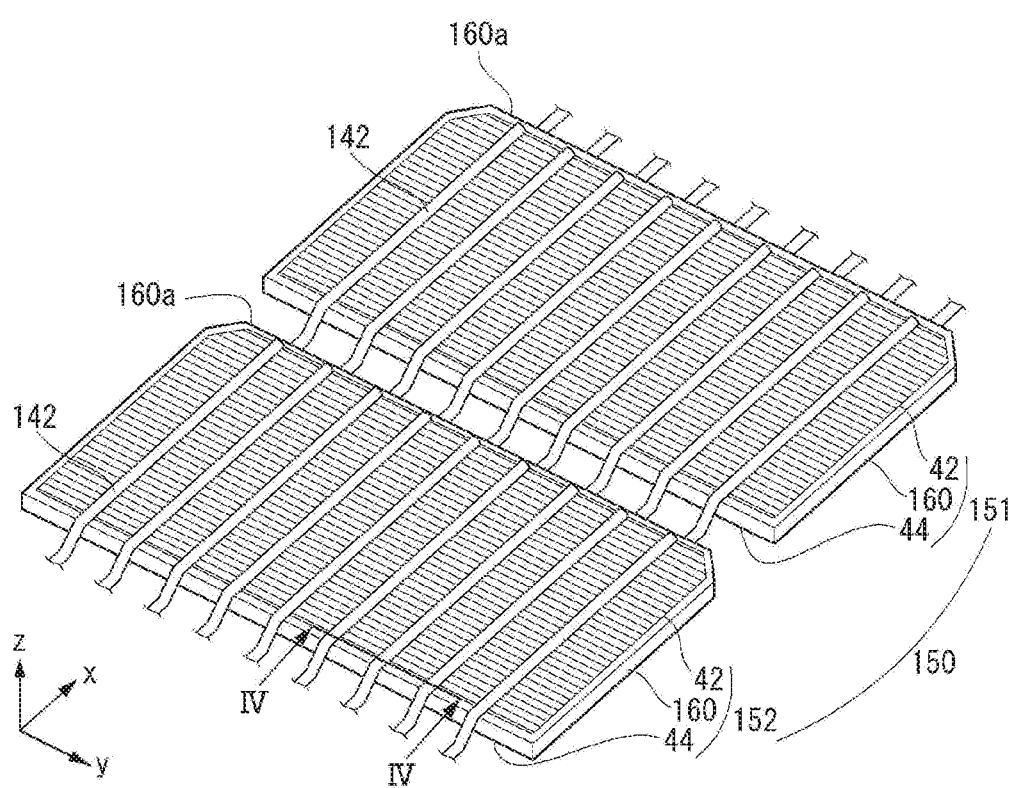
FIG. 3 is a perspective view illustrating a solar cell module according to an embodiment of the present disclosure.
Figure 4:
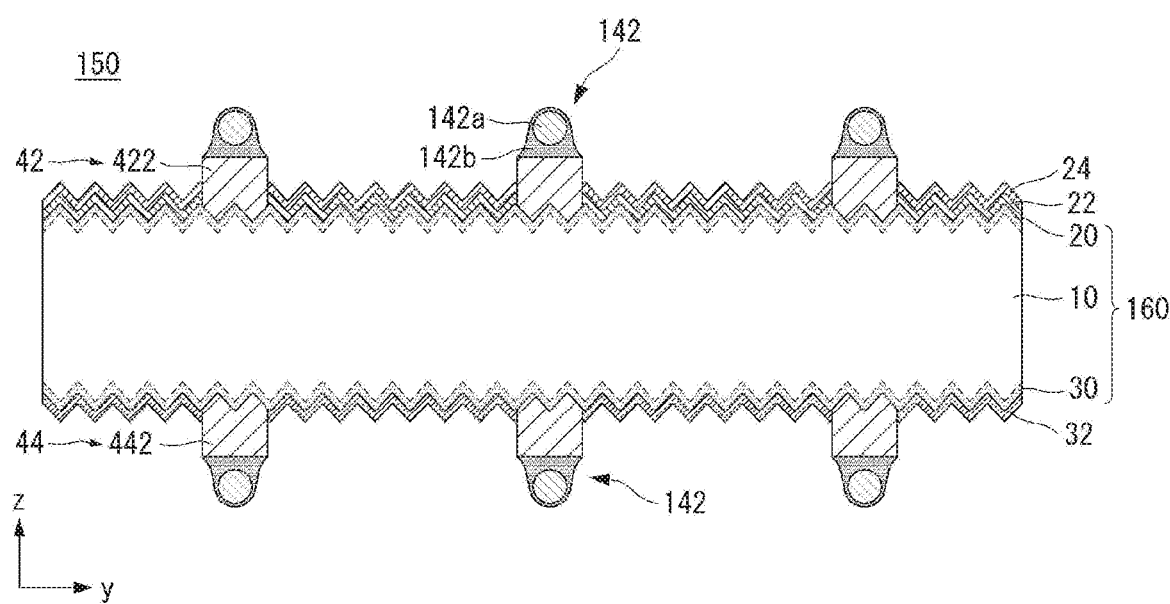
FIG. 4 is a cross-sectional view taken along a line IV-IV in FIG. 3.

Hereinafter, with reference to FIGS. 3 and 4, the configuration of a solar cell module and a solar cell according to an embodiment of the present disclosure will be described in more detail. FIG. 3 is a perspective view illustrating an example of a solar cell module constituting the solar panel 100 shown in FIG. 1, and FIG. 4 is a cross-sectional view taken along a line IV-IV in FIG. 3. For simplicity, electrodes 42 and 44 are schematically illustrated in FIG. 4.

Referring to FIGS. 3 and 4, the solar cell 150 includes a semiconductor substrate 160, conductivity type regions 20 and 30 formed at or on the semiconductor substrate 160, and electrodes 42 and 44 connected to the conductivity type regions 20 and 30. The conductivity type regions 20 and 30 can include a first conductivity type region 20 having a first conductivity type and a second conductivity type region 30 having a second conductivity type. The electrodes 42 and 44 can include a first electrode 42 connected to the first conductivity type region 20 and a second electrode 44 connected to the second conductivity type region 30. Furthermore, the solar cell 150 can further include first and second passivation layers 22 and 32, an anti-reflection layer 24, and the like.

The semiconductor substrate 160 can be composed of a crystalline semiconductor (for example, a single crystal or polycrystalline semiconductor, for example, a single crystal or polycrystalline silicon) including a single semiconductor material (for example, a group 4 element). Then, since the semiconductor substrate 160 having a high degree of crystallinity and having a few defects is used as a base, the solar cell 150 can have excellent electrical characteristics.

The front surface and/or the back surface of the semiconductor substrate 160 can be textured to have unevenness. The unevenness can have, for example, a pyramid shape having an irregular size, whose outer surface is composed of the plane (111) of the semiconductor substrate 160. As a result, the reflectance of light can be reduced if having a relatively large surface roughness. However, the present disclosure is not limited thereto.

In this embodiment, the semiconductor substrate 160 includes a base region 10 having the first or second conductivity type by dopping a first or second conductivity type dopant with a doping concentration lower than the first or second conductivity type region 20, 30. As an example, the base region 10 can have the second conductivity type in this embodiment.

As an example, the first conductivity type region 20 can forms an emitter region that forms a p-n junction with the base region 10. The second conductivity type region 30 can form a back surface field to form a back field region for preventing recombination. Here, the first and second conductivity type regions 20 and 30 can be formed as a whole on the front surface and the back surface of the semiconductor substrate 160. Thus, the first and second conductivity type regions 20 and 30 can be formed with a sufficient area without additional patterning. However, the present disclosure is not limited thereto.

In this embodiment, the base region 10 and the conductivity type regions 20 and 30 being included in the semiconductor substrate 160 are exemplified as regions having a crystal structure of the semiconductor substrate 160 and different conductivity type, doping concentration, etc. That is, it is illustrated that the conductivity type regions 20 and 30 are doped regions constituting a part of the semiconductor substrate 160. However, the present disclosure is not limited thereto. Therefore, at least one of the first conductivity type region 20 and the second conductivity type region 30 can be formed of an amorphous, microcrystalline or polycrystalline semiconductor layer or the like, which is formed on the semiconductor substrate 160 as a separate layer. Other variations are possible.

The first conductivity type dopant included in the first conductivity type region 20 can be an n-type or p-type dopant, and the second conductivity type dopant included in the base region 10 and the second conductivity type region 30 can be a p-type or n-type dopant. Group 3 elements such as boron (B), aluminum (Al), gallium (Ga), or indium (In) can be used as the p-type dopant, and group 5 elements such as phosphorus (P), arsenic (As), bismuth (Bi), and antimony (Sb) can be used as the n-type dopant. The second conductivity type dopant in the base region 10 and the second conductivity type dopant in the second conductivity type region 30 can be the same material or different materials.

For example, the first conductivity type region 20 can have a p-type, the base region 10 and the second conductivity type region 30 can have an n-type. Then, holes having a slower moving speed than electrons can move to the front surface of the semiconductor substrate 160, rather than the back surface thereof, thereby improving the conversion efficiency. However, the present disclosure is not limited thereto, and the opposite case is also possible.

An insulating layer such as the first and second passivation layers 22 and 32 for immobilizing defects of the conductivity type regions 20 and 30, and the anti-reflection layer 24 for preventing reflection of light can be formed on the surface of the semiconductor substrate 160. Such an insulating layer can be composed of an undoped insulating layer which does not contain a dopant separately. The first and second passivation layers 22 and 32 and the anti-reflection layer 24 can be formed substantially entirely on the front surface and back surface of the semiconductor substrate 160 except for parts (more precisely, parts where a first or second opening is formed) corresponding to the first or second electrode 42, 44.

For example, the first or second passivation layer 22, 32 or the anti-reflection layer 24 can have a silicon nitride layer, a silicon nitride layer containing hydrogen, a silicon oxide layer, a silicon oxynitride layer, an aluminum oxide layer, any one single layer selected from a group consisting of $MgF_2$, $ZnS$, $TiO_2$ and $CeO_2$ or a multi-layered structure in which two or more layers are combined. For example, the first or second passivation layer 22 or 32 can include a silicon oxide layer, a silicon nitride layer, or the like having a fixed positive charge when the first or second conductivity type region 20 or 30 has an n-type, and can include an aluminum oxide layer, or the like having a fixed negative charge when the first or second conductivity type region 20 or 30 has a p-type. As one example, the anti-reflection layer 24 can include silicon nitride. In addition, the material of the insulating layer, the multi-layered structure, and the like can be variously modified.

The first electrode 42 is electrically connected to the first conductivity type region 20 through a first opening and the second electrode 44 is electrically connected to the second conductivity type region 30 through a second opening. The first and second electrodes 42 and 44 are made of various materials (for example, metal materials) and can be formed to have various shapes. The shape of the first and second electrodes 42 and 44 will be described later.

As described above, in this embodiment, since the first and second electrodes 42 and 44 of the solar cell 150 have a certain pattern, the solar cell 150 has a bi-facial structure in which light can be incident on the front surface and the back surface of the semiconductor substrate 160. Accordingly, the amount of light used in the solar cell 150 can be increased to contribute to the efficiency improvement of the solar cell 150.

However, the present disclosure is not limited thereto, and it is also possible that the second electrode 44 is formed entirely on the back surface of the semiconductor substrate 160. It is also possible that the first and second conductivity type regions 20 and 30 and the first and second electrodes 42 and 44 are positioned together on one surface (for example, the back surface) of the semiconductor substrate 160, and it is also possible that at least one of the first and second conductivity type regions 20 and 30 is formed over both surface of the semiconductor substrate 160. That is, the solar cell 150 described above is merely an example, and the present disclosure is not limited thereto.

The solar cell 150 described above is electrically connected to the neighboring solar cell 150 by the wiring member 142 positioned (e.g., in contact with) on the first electrode 42 or the second electrode 44.

The solar cell 150 having such a configuration is fabricated by dividing a mother solar cell into two or more pieces, such as half, and when first and second solar cells 151 and 152 are combined, it can be a single mother solar cell. Such a mother solar cell will be described in detail later with reference to FIG. 6.

In an embodiment of the present disclosure, the solar cell module includes the plurality of solar cells and the plurality of wiring members for electrically connecting neighboring two solar cells. In FIG. 3, only two first and second solar cells 151 and 152 are selectively shown for simplicity of illustration. In addition, in FIG. 3, the first and second solar cells 151 and 152 are schematically illustrated mainly on the semiconductor substrate 160 and the electrodes 42 and 44.

Figure 5:
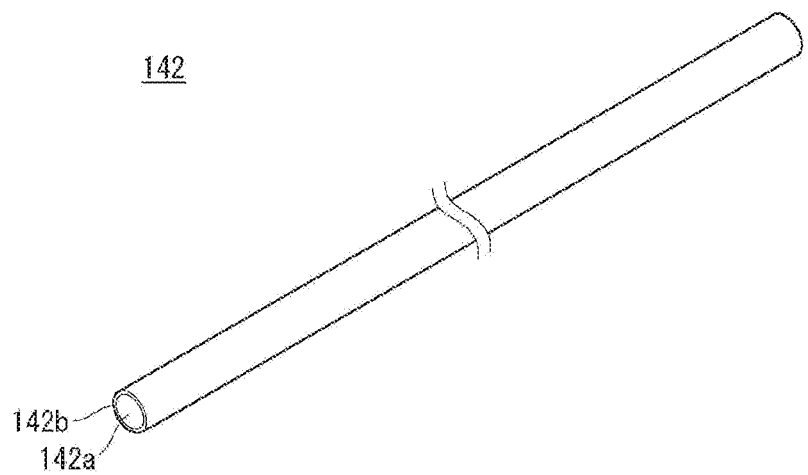
FIG. 5 is a perspective view showing an overall appearance of a wiring member.
Figure 5:
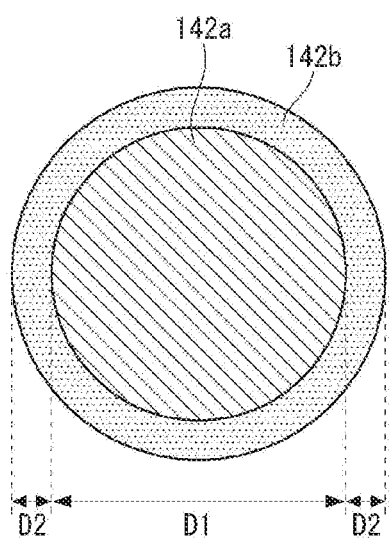

Regarding the wiring member, it will be described in detail with reference to FIGS. 4 and 5. FIG. 5 is a perspective view showing an overall appearance of a wiring member.

Referring to FIGS. 4 and 5, the wiring member 142 connects the second electrode 44 positioned on a back surface of the first solar cell 151 and the first electrode 42 positioned on a front surface of the second solar cell 152 disposed to be adjacent to the right side of the first solar cell 151. Another wiring member 142 connects the first electrode 42 positioned on a front surface of the first solar cell 151 and the second electrode 44 positioned on a back surface of another solar cell disposed to be adjacent to the left side of the first solar cell 151. Other wiring member 142 connects the second electrode 44 positioned on a back surface of the second solar cell 152 and the first electrode 42 positioned on a front surface of other solar cell disposed to be adjacent to the right side of the second solar cell 152. Accordingly, the plurality of solar cells 150 can be connected to each other by the wiring member 142 to form one row. Hereinafter, the description of the wiring member 142 can be applied to all the wiring member 142 connecting two neighboring solar cells 150.

As such, the wiring member electrically and physically connects the first electrode 42 disposed on the front surface of the neighboring first solar cell 151 and the second electrode 44 disposed on the back surface of the second solar cell 152. Thus, the wiring member 142 is bent in a form of a diagonal line between the first solar cell 151 and the second solar cell 152 so that a part of the wiring member 142 is connected to the first electrode 42 disposed on the front surface of the first solar cell 151, and the other part is connected to the second electrodes 44 disposed on the back surface of the second solar cell 152, respectively, to electrically connect two neighboring solar cells.

However, at this time, if the number of wiring members for connecting the two neighboring solar cells is too large, or the thickness of the wiring members becomes thick, it is difficult to bend them, so that a distance between the first and second solar cells is inevitably increased. As a result, the overall size of the solar panel increases.

Furthermore, when the solar cell module is configured with the divided solar cells as in the present disclosure, since the number of solar cells forming a string increases in multiples than that of the mother solar cell, the size of the solar panel is bound to be larger.

In view of this, it is preferable that the wiring member 142 is configured to have a thin diameter wire shape so as to bend well. Since the wiring member 142 has a wire shape unlike a ribbon having a relatively wide width (for example, 1 mm to 2 mm), which is used in the past, and also, the thickness is very thin than that of the ribbon, the amount of light incident on the solar cell can be increased more effectively. In addition, since it bends more easily than the conventional ribbon, in one embodiment, it is possible to prevent the overall size of the solar cell panel from growing by effectively reducing the distance between the solar cells formed of the divided solar cells.

As an example, the maximum width of the wiring member 142 is 250 µm to 500 µm or approximately thereabout, for example 270 µm to 320 µm or approximately thereabout. In addition, the maximum width of the wiring member can be adjusted by using the number of wiring members as a variable, for example, when the number of wiring members becomes large, the diameter of the wiring member becomes smaller as the number increases in order to effectively maintain the distance between the first and second solar cells, and when the number of wiring member becomes small, the diameter of the wiring member can be larger. This is described in detail below.

The number of the wiring members 142 can be greater than the number (for example, 2 to 5) of the conventional ribbons on the basis of one surface of each solar cell 150. Then, a movement distance of carriers can be reduced by a large number of the wiring members 142 while minimizing the optical loss and material cost by the wiring member 142 having a small width. Thus, the efficiency of the solar cell 150 and the output of the solar cell panel 100 can be improved by reducing the movement distance of the carriers while reducing the optical loss, and productivity of the solar cell panel 100 can be improved by reducing the material cost due to the wiring member 142.

In order to prevent the process of attaching the wiring member 142 to the solar cell 150 from becoming complicated when the number of the wiring member 142 having the small width is used in a large number, in this embodiment, the wiring member 142 can have a structure including a core layer 142a and a solder layer 142b formed on the surface of the core layer 142a as shown in (A) of FIG. 5. Then, a large number of the wiring member 142 can be effectively attached by the process of applying heat and pressure while the wiring member 142 is placed on the solar cell 150.

The wiring member 142 or the core layer 142a, which is included in the wiring member 142 and occupies most of the wiring member 142, can include rounded parts. That is, at least a part of the cross section of the wiring member 142 or the core layer 142a can include a circle, a part of a circle, an ellipse, a part of an ellipse, or a part made of a curved line. In addition, the wiring member 142 can have a polygonal shape having at least three vertices, that is, a cross-section of the wiring member can have a figure shape surrounded by three or more line segments, and in this case, the light incident toward the wiring member can cause diffused reflection on the surface of the wiring member, thereby increasing the amount of light incident on the solar cell more effectively.

If it has such a shape, the wiring member 142 is formed in a structure in which the solder layer 142b is entirely positioned on the surface of the core layer 142a, the process of separately applying the solder material and the like are omitted, so that the wiring member 142 can be attached by positioning the wiring member 142 directly on the solar cell 150.

Thus, the process of attaching the wiring member 142 can be simplified. In addition, a light incident on the solar cell can be reflected or diffused by a rounded portion of the wiring member 142 so that the light reflected from the wiring member 142 can be re-entered into the solar cell 150. Accordingly, since the amount of light incident on the solar cell 150 is increased, the efficiency of the solar cell 150 and the output of the solar cell panel 100 can be improved.

In addition, as the wiring member has a wire shape, the wiring member can be stretched or bent well, thereby effectively reducing the distance between the first and second solar cells, and as a result, even when the solar cell panel is composed of the divided solar cells, the total size of the solar cell panel is not increased, and thus the solar cell panel can be produced even with the divided solar cells using the existing equipment that is, the manufacturing equipment installed to manufacture the solar cells using the mother solar cell.

The wiring members 142 can be disposed by about 6 to 24 based on one surface of the solar cell 150, for example by about 8 to 12. The wiring members can be positioned on the solar cell 150 at a uniform distance from each other.

In this embodiment, the wiring member 142 can include the core layer 142a made of metals and the solder layer 142b that is formed on the surface of the core layer 142a and includes solder material to enable soldering with the electrodes 42,44. That is, the solder layer 142b can serve as a kind of adhesive layer. For example, the core layer 142a can include Ni, Cu, Ag, Al, or the like as a main material (for example, a material containing 50 wt % or more, more specifically, a material containing 90 wt % or more). The solder layer 142b can include a solder material such as Pb, Sn, SnIn, SnBi, SnPb, SnPbAg, SnCuAg, SnCu, or the like as a main material. However, the present disclosure is not limited thereto, and the core layer 142a and the solder layer 142b can include various materials.

As shown in (B) of FIG. 5, a total thickness of the wiring member 142 composed as described above, that is, the total thickness (D2+D1+D2) including the core layer 142a and the solder layer 142b, is 270 μm to 320 μm or approximately thereabout, and it is preferable that the thickness D1 of the core layer 142a among this is 240 to 280 μm or approximately thereabout, for example, 255 to 265 μm or approximately thereabout. Here, the thickness of the core layer 142a refers to an average value of the thicknesses measured based on the cross section.

If the thickness D1 of the core layer 142a is smaller than 240 μm or approximately thereabout, the line resistance becomes too large and the output efficiency decreases excessively, and if it is thicker than 280 μm or approximately thereabout, it is impossible to bend the wiring member 142 into a desired shape due to the core layer made of metal, and thus it is impossible to reduce the size between the first and second solar cells to a desired size.

In addition, the solder layer 142b for example has a thickness D2 of at least 15 μm or more or approximately thereabout so that the wiring member 142 can be bonded to the electrode (or a pad in the case of having the pad) with a desired bonding force in the tabbing process. Here, the thickness D2 refers to the thickness of one cross-section of the solder layer 142b surrounding the core layer 142a, and the total thickness of the solder layer 142b is a value obtained by adding both cross-sections together. During the tabbing process, the solder layer 142b is melted and solidified at the melting temperature, thereby bonding the wiring member to the electrode (or the pad in the case of having the pad). However, if the thickness D2 of the solder layer 142b is less than 15 μm or approximately thereabout, the amount of solder applied to the pad or the electrode can be small and cannot have a sufficient bonding strength desired. Furthermore, when the wiring member 142 is bonded to the pad, the whole pad needs to be applied by the solder, however, if the thickness D2 of the solder layer is less than 15 μm or approximately thereabout, the whole pad cannot be applied with the solder, and thus the desired bonding strength cannot be obtained.

In addition, the thickness D2 of the solder layer 142b is for example less than 20 μm or approximately thereabout. If the thickness D2 of the solder layer 142b is greater than 20 μm or approximately thereabout, the curvature of the wiring member is sharply dropped, and it is virtually impossible to maintain the distance between two neighboring solar cells at 0.5 to 1.5 mm.

Considering this point, in order to maintain the distance between the two solar cells at 0.5 to 1.5 mm, it is preferable that the thickness D1 of the core layer 142a and the thickness D2 of the solder layer 142b are 0.05<D2/D1<0.08. Here, the thickness D2 of the solder layer 142b refers to the thickness of only one surface or section of the solder layer 142b. In embodiments of the invention, the thickness D2 of the solder layer 142b can be 5% to 8% of the thickness D1 of the core layer 142a or approximately thereabout to maintain the distance between the two solar cells 151 and 152 at 0.5 to 1.5 mm or approximately thereabout.

On the other hand, when the wiring member 142 is attached to the solar cell 150 by a tabbing process, as shown in FIG. 4, a shape of the solder layer 142b is changed in a part of the wiring member 142 attached to or connected to the solar cell 150.

Figure 6:
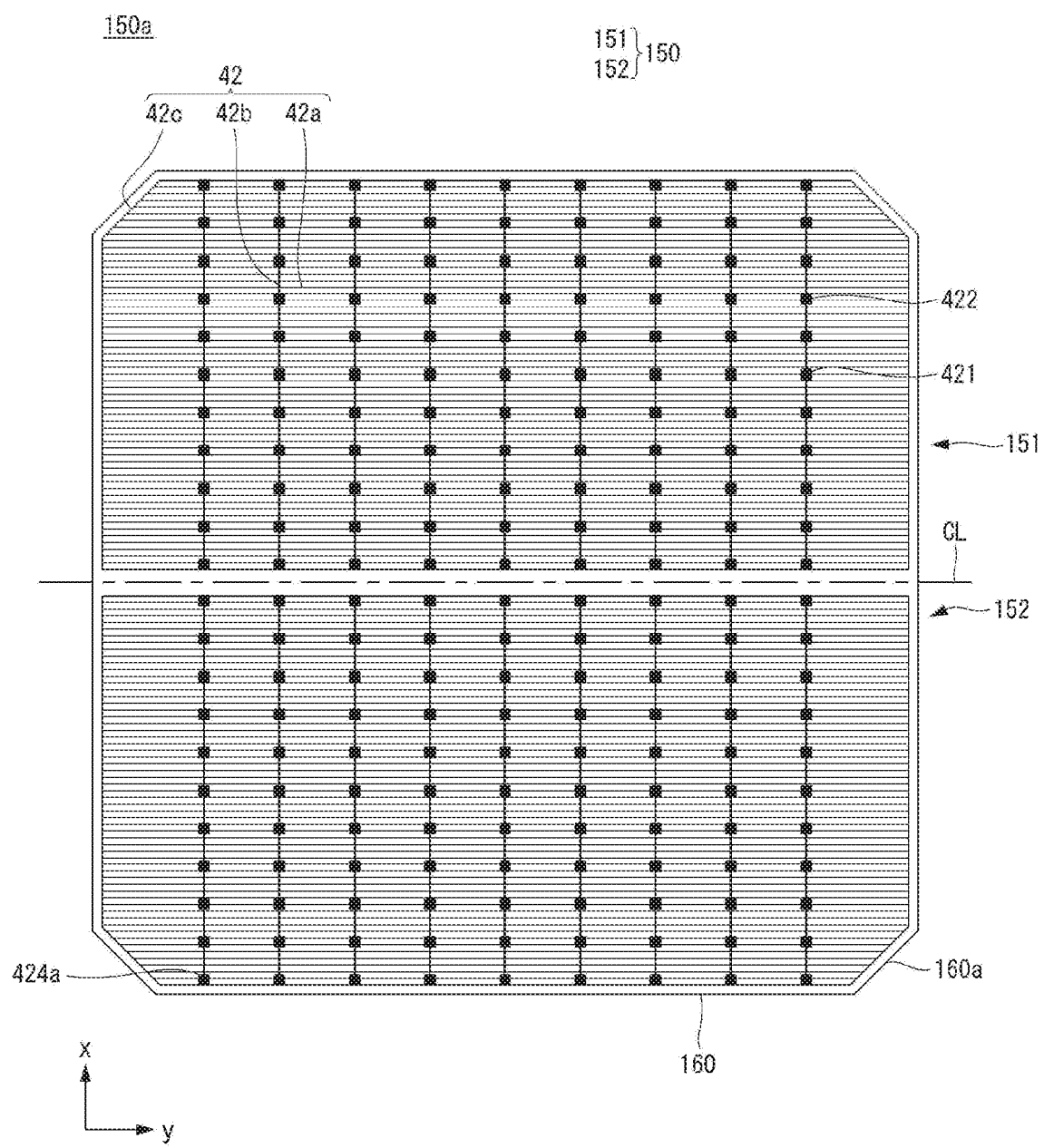
FIG. 6 is a plan view schematically showing a front surface of a mother solar cell forming a half cut cell shown in FIG. 4.

More specifically, the wiring member 142 is attached to the electrodes 42 and 44 (the pad when the pad is provided) by the solder layer 142b. At this time, the solder layer 142b of each wiring member 142 is positioned on the electrodes 42 and 44 separately from the other wiring member 142. When the wiring member 142 is attached to the solar cell 150 by the tabbing process, each solder layer 142b flows down to the first or second electrodes 42, 44 (more specifically, the pad parts 422 and 424) as a whole during the tabbing process, and a width of the solder layer 142b can gradually increase toward the pad parts 422, 442 at a part adjacent to each pad part 422, 442 or a part positioned between the pad parts 422, 442 and the core layer 142a. As one example, the part adjacent to the pad parts 422 and 442 in the solder layer 142b can have a width equal to or greater than a diameter of the core layer 142a. At this time, the width of the solder layer 142b can be equal to or less than a width of the pad parts 422, 442. In the embodiment of FIG. 6, also shown are an inner pad part 421 and an outer pad part 424a.

More specifically, the solder layer 142b has a shape protruding toward the outside of the solar cell 150 along the shape of the core layer 142a in an upper part of the core layer 142a. On the other hand, the solder layer 142b includes a part having a concave shape with respect to the outside of the solar cell 150 in a lower part of the core layer 142a or a part adjacent to the pad parts 422 and 442. As a result, an inflection point where the curvature changes is positioned on the side surface of the solder layer 142b. It can be seen that the wiring member 142 are individually attached and fixed by the solder layer 142b without being inserted or covered in a separate layer, film, or the like from this shape of the solder layer 142b. The solar cell 150 and the wiring member 142 can be connected by a simple structure and a process by fixing the wiring member 142 by the solder layer 142b without using a separate layer or a film. Particularly, the wiring member 142 having a narrow width and a rounded shape as in the present embodiment can be attached without using a separate layer, a film, (for example, a conductive adhesive film including a resin and a conductive material) or the like, so that the process cost and time of the wiring member 142 can be minimized.

On the other hand, the part of the wiring member 142 positioned between the neighboring solar cells 150 (that is, outside the solar cell 150), which is not applied with heat or is applied with relatively less heat even after the tabbing process, can have a shape in which the solder layer 142b has a uniform thickness as shown in FIG. 4.

According to the present embodiment, optical loss can be minimized by diffused reflection or the like using a wire-shaped wiring material 142, and it is possible to reduce the movement path of the carrier by increasing the number of the wiring member 142 and reducing a pitch of the wiring member 142. In addition, the width or diameter of the wiring member 142 can be reduced, so that the material cost can be greatly reduced. Accordingly, the efficiency of the solar cell 150 and the output of the solar cell panel 100 can be improved.

The solar cell module of an embodiment having such a configuration is made through the solar cell made by dividing the mother solar cell into a plurality. FIG. 6 is a plan view illustrating a front surface of an example mother solar cell. Hereinafter, referring to FIGS. 3 and 6, an embodiment of a solar cell module will be described.

In the present embodiment, one mother solar cell 150a is cut along a cutting line CL to manufacture first and second solar cells 151 and 152 which are a plurality of solar cells. Each of the first and second solar cells 151 and 152, which are unit solar cells, functions as one solar cell 150. When the mother solar cell 150a is divided into two solar cells 150 as described above, cell to module loss (CTM loss), which occurs when the plurality of solar cells 150 are connected to form the solar panel 100, can be reduced. That is, if the area of the solar cell is reduced to reduce the current generated by the solar cell itself, the CTM loss of the solar panel 100 can be reduced by reducing the current reflected by the squared value even if the number of the solar cells 150 reflected as it is increased.

In this embodiment, after manufacturing the mother solar cell 150a according to a prior manufacturing method, the mother cell can be cut to reduce the area of the solar cell 150. According to this, since the equipment is used as it is, the mother solar cell 150a can be cut after using the optimized production conditions as it is. This minimizes the burden on equipment and process costs. On the other hand, reducing the size of the mother solar cell (150a) itself, there is a burden such as replacing the used equipment or reset the production conditions.

In general, the semiconductor substrate 160 of the mother solar cell 150a is manufactured from an ingot of approximately circular shape, and lengths of sides in two axes (for example, an axis parallel to a finger line 42a and an axis parallel to a bus bar 42b) orthogonal to each other, such as circular, square or similar shapes, are the same or almost similar to each other. For example, in the present embodiment, the semiconductor substrate 160 of the mother solar cell 150a can have an octagonal shape having inclined sides 160a at four corners thereof in an approximately square shape. With such a shape, the semiconductor substrate 160 having the largest area can be obtained from the same ingot. Accordingly, the mother solar cell 150a has a symmetrical shape, and a maximum horizontal axis and a maximum vertical axis, and a minimum horizontal axis and a minimum vertical axis have the same distance.

In this embodiment, since the mother solar cell 150a is cut along the cutting line CL to form the solar cell 150, the semiconductor substrate 160 of the solar cell 150 has a shape having a long axis and a short axis. In the present embodiment, the cutting line CL is parallel to the first direction (y-axis direction in the drawing) in the longitudinal direction of the first and second conductivity-type regions 20 and 30 and the finger lines 42a (or first finger lines 42a) and 44a (or second finger lines 44a). It can be continued to intersect the second direction (the x-axis direction in the drawing) which is the extending direction of the bars 42b (or first bus bars 42b) and 44b (or second bus bars 44b). Therefore, the plurality of solar cells 150 can be formed long in the first direction.

Accordingly, in the first electrode 42 positioned on the front surface of the semiconductor substrate 160 in each solar cell 150, a plurality of first finger lines 42a extend in the first direction parallel to the long axis and are positioned in parallel with each other, and a first bus bar 42b is formed in the second direction parallel to the short axis. The first bus bar 42b can include a plurality of first pad parts 422 spaced apart from each other in the second direction parallel to the short axis. Similarly, in the second electrode 44, a plurality of second finger lines extend in the first direction parallel to the long axis and are positioned in parallel with each other, and a second bus bar is formed in the second direction parallel to the short axis. The second bus bar can include a plurality of second pad parts. Descriptions of the shape, position, and the like of the first finger line 42a and the first bus bar 42b can be applied to the second finger line and the second bus bar as it is. The first electrode 42 also includes connection lines 42c at the inclined sides 160a that connect some of the plurality of first finger lines 42a along a periphery of the first and second solar cells 151 and 152.

Accordingly, the long axis of the solar cell 150 is positioned in parallel with the first direction, the short axis of the solar cell 150 is positioned in parallel with the second direction, and the wiring member 142 connects the neighboring first and second solar cells 151 and 152 in the short axis direction (see FIG. 3).

In FIG. 3, after cutting one mother solar cell 150 into two, an inclined side 160a is disposed to be positioned in the same direction, so that it is illustrated that the cut surfaces along the cutting line CL are not in contact with each other. As a result, when the cut surfaces formed by the cutting lines CL are not disposed to face each other, the risk of electrical shorting and the like can be reduced as compared to face each other, however, the present disclosure is not limited thereto, and the cut surfaces can be disposed to face each other.

In the above-described drawings and descriptions, it was illustrated that one mother solar cell 150a was cut along one cutting line CL to form two solar cells 150. However, the present disclosure is not limited thereto, and it is also possible to form three or more solar cells 150 by cutting one mother solar cell 150a along two or more cutting lines CL.

In addition, in the above-described drawing and description, the first electrode 42 and/or the second electrode 44 are not formed near the cutting line CL, so that the first electrode 42 corresponding to each solar cell 150 and/or the second electrode 44 is positioned apart from each other with the cutting line CL interposed therebetween. However, the present disclosure is not limited thereto, and the first electrode 42 and/or the second electrode 44 corresponding to the plurality of solar cells 150 can be formed to be connected to each other and separated from each other by the cutting line CL in the mother solar cell 150a. For example, after the mother solar cell 150a having the bus bar and the pad part is formed, the solar cell 150 can be formed by cutting the mother solar cell 150a along the cutting line CL parallel to the first direction.

The structures of the first and second electrodes 42 and 44 described above can be applied to the plurality of solar cells 150, respectively, or can be applied to any one or some of the plurality of solar cells 150.

Figure 7:
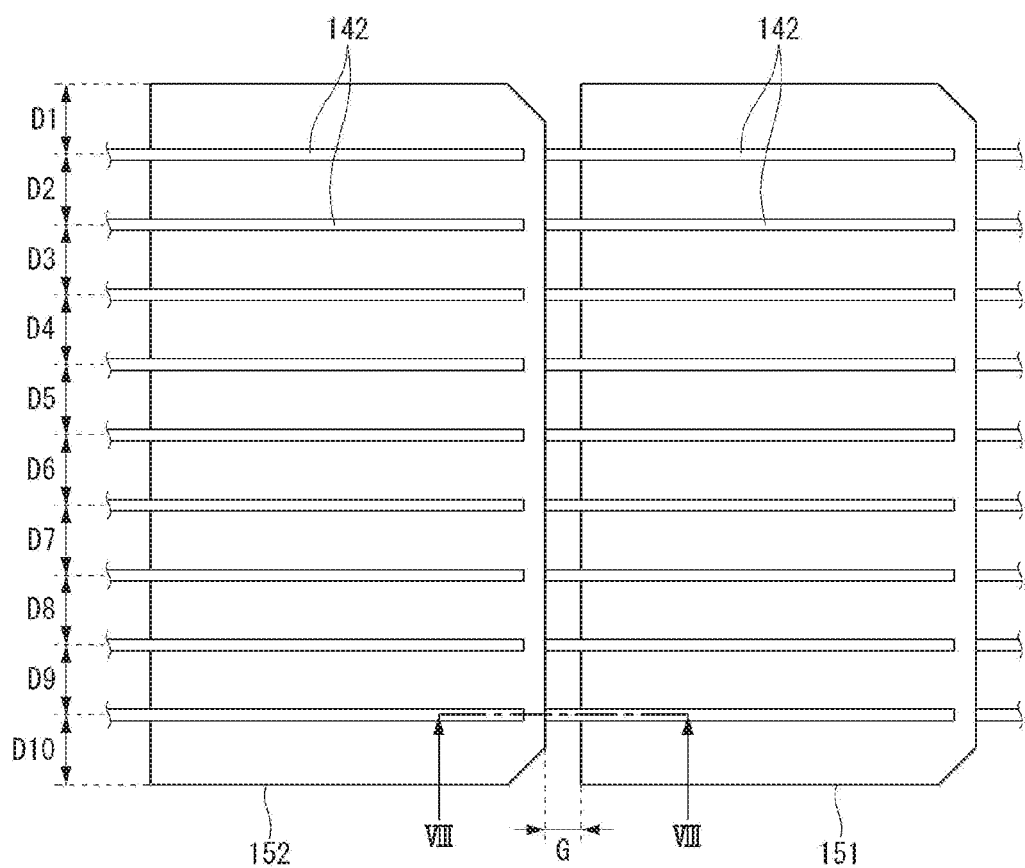
FIG. 7 is a plan view illustrating a schematic view of a solar cell module shown in FIG. 3.
Figure 8:
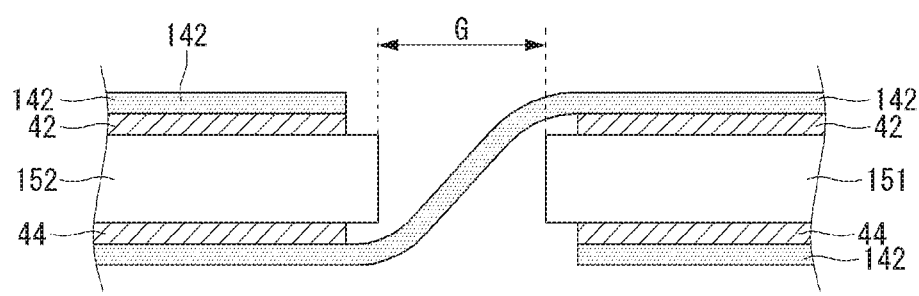
FIG. 8 is a cross-sectional view taken along a line VIII-VIII in FIG. 7.

FIG. 7 is a plan view illustrating a schematic view of a solar cell module shown in FIG. 3. FIG. 8 is a cross-sectional view taken along a line VIII-VIII in FIG. 7. FIG. 7 and FIG. 8 are shown in a simplified form for convenience of description.

In the solar cell module according to an embodiment, the first and second solar cells 151 and 152 are disposed to face each other with neighboring side surfaces, and also spaced apart from each other to have a first distance G. In FIG. 7, only neighboring first and second solar cells 151 and 152 are illustrated, but two neighboring solar cells in one entire string can be disposed to have such a first distance G.

The plurality of wiring members 142 are disposed to connect the neighboring first and second solar cells 151 and 152 and can be separated from each other by distances D1-D10, each of which can be a constant interval or a varying interval, one side of the wiring member is joined to the first electrode 42 disposed on the front surface of the first solar cell 151, and the other side is joined to the second electrode 44 disposed on the back surface of the second solar cell 152. Therefore, the wiring member 142 is bent between the first and second solar cells 151 and 152. More precisely, the wiring member 142 is bent to ride down the side of the first solar cell 151 between the first and second solar cells 151 and 152. In addition, the wiring member 142 is close to the side of the second solar cell 152 and is oriented upwardly with respect to the side, or at least bent in parallel with the second electrode 44 of the second solar cell 152. As described above, the wiring member 142 has an inflection point at which the bending direction is changed at points adjacent to the side of the first solar cell 151 and the side of the second solar cell 152.

Therefore, the amount of bending of the wiring member 142 is determined according to this inflection point, and the first distance G, which is a degree of spreading of the first and second solar cells, is determined according to the bending of the wiring member 142. The first distance G can be changed based on the thickness of the wiring member 142.

In one example, the second solar cell 152 can be disposed to be adjacent to the first solar cell 151 by rotating 180 degrees to have the same shape as the first solar cell. Here, the first solar cell 151 and the second solar cell 152 are solar cells formed by cutting one mother solar cell 150 along the cutting line CL. Accordingly, both the first and second solar cells 151 and 152 can be disposed so that chamfers face to the right side, and cut surfaces (surfaces which cut the mother solar cell) face to the left side.

In this arrangement, as well as improve the appearance of the solar cell module, there is an effect to further reduce the distance G between the first and second solar cells 151 and 152. In one example, when one mother solar cell 150 is cut with a laser along the cutting line CL, the surface of the solar cell to which the laser is irradiated generates burrs due to the high heat of the laser and the generated burrs are fused around the cut surface. In one example, the solar cell 150 can divide the first and second solar cells into two by irradiating a laser on the back surface, thereby preventing the pn junction from being damaged by irradiating the laser on the back surface rather than the front surface where the light is incident. Thus, in this case, the burrs can be fused on the back surface of the solar cell.

If the first and second solar cells 151 and 152 are disposed to face the cut surfaces, and the first and second solar cells 151 and 152 are connected by the wiring member 142, since the wiring member 142 should be bent in an oblique direction between the first and second solar cells 151 and 152, the burrs fused to the cut surfaces in a protrusion shape can be electrically shorted with the wiring member. Therefore, when the first and second solar cells 151 and 152 are disposed and connected to face the cut surfaces differently from the arrangement shown in FIG. 7, there can be a limit in reducing the distance G between the first solar cell 151 and the second solar cell 152, for example, at least 2.5 mm should have a distance.

However, according to the arrangement as shown in FIG. 7, the first solar cell 151 is disposed so that the cut surface of the first solar cell 151 faces the second solar cell, but the second solar cell 152 is disposed so that the non-cut surface of the second solar cell 152 faces the cut surface of the first solar cell 151. Since a part of the wiring member 142 is disposed on the back surface of the second solar cell 152, and the other part is positioned on the front surface of the first solar cell 151, the wiring member is bent in an oblique direction upward between the first solar cell 151 and the second solar cell 152. In this case, since the first solar cell 151 has the non-cut surface and the second solar cell 152 has the cut surface, but the wiring member 142 is disposed on the front surface, two neighboring solar cells 151 and 152 can be electrically connected to each other to avoid interference of burrs formed on the back surface of the cut surface. Therefore, the distance G between the first and second solar cells 151 and 152 can be less than before, for example, 2.5 mm, for example, depending on the thickness, number, etc. of wiring members, the distance G can be determined in a range of 0.5 mm to 1.5 mm.

Figure 9:
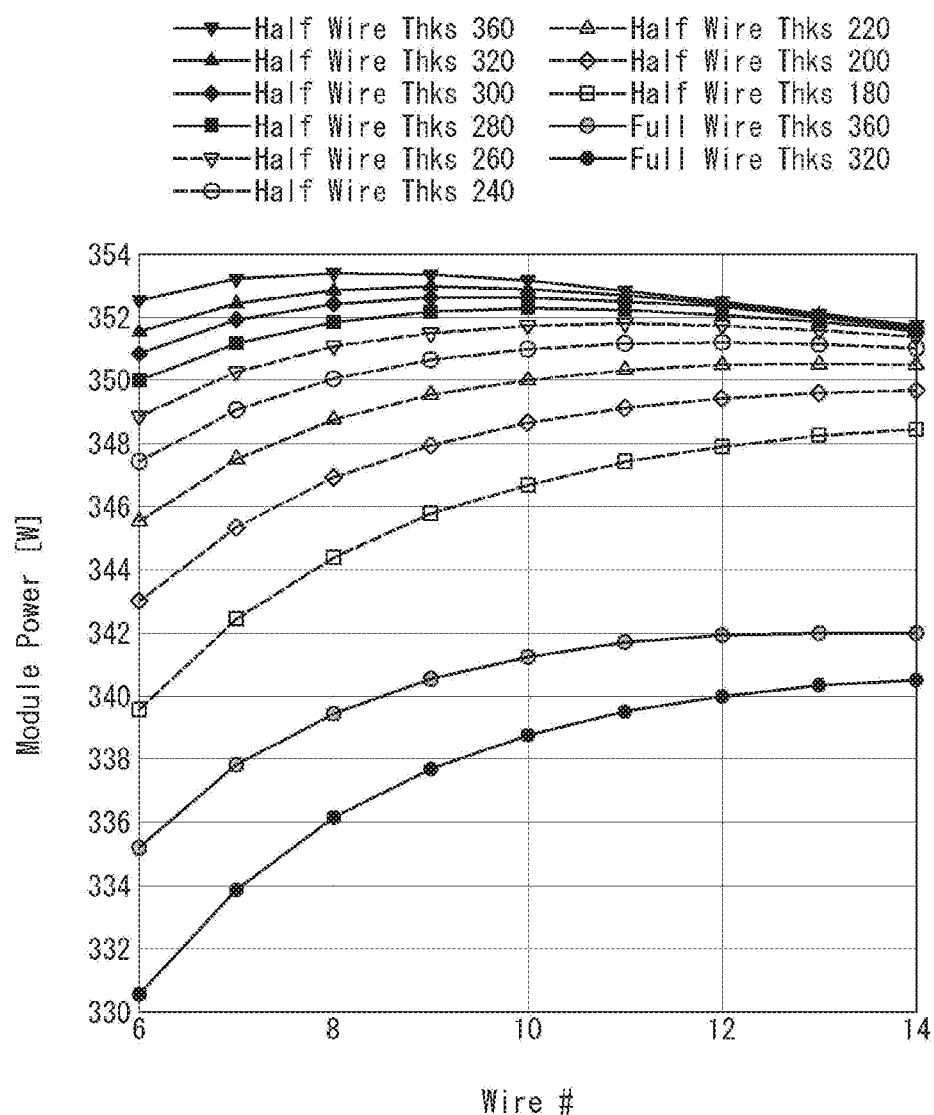
FIGS. 9 and 10 are graphs showing simulation results of outputs depending on the number of wiring members measured by diameters, numbers of wiring members and distances between solar cells as variables.
Figure 10:
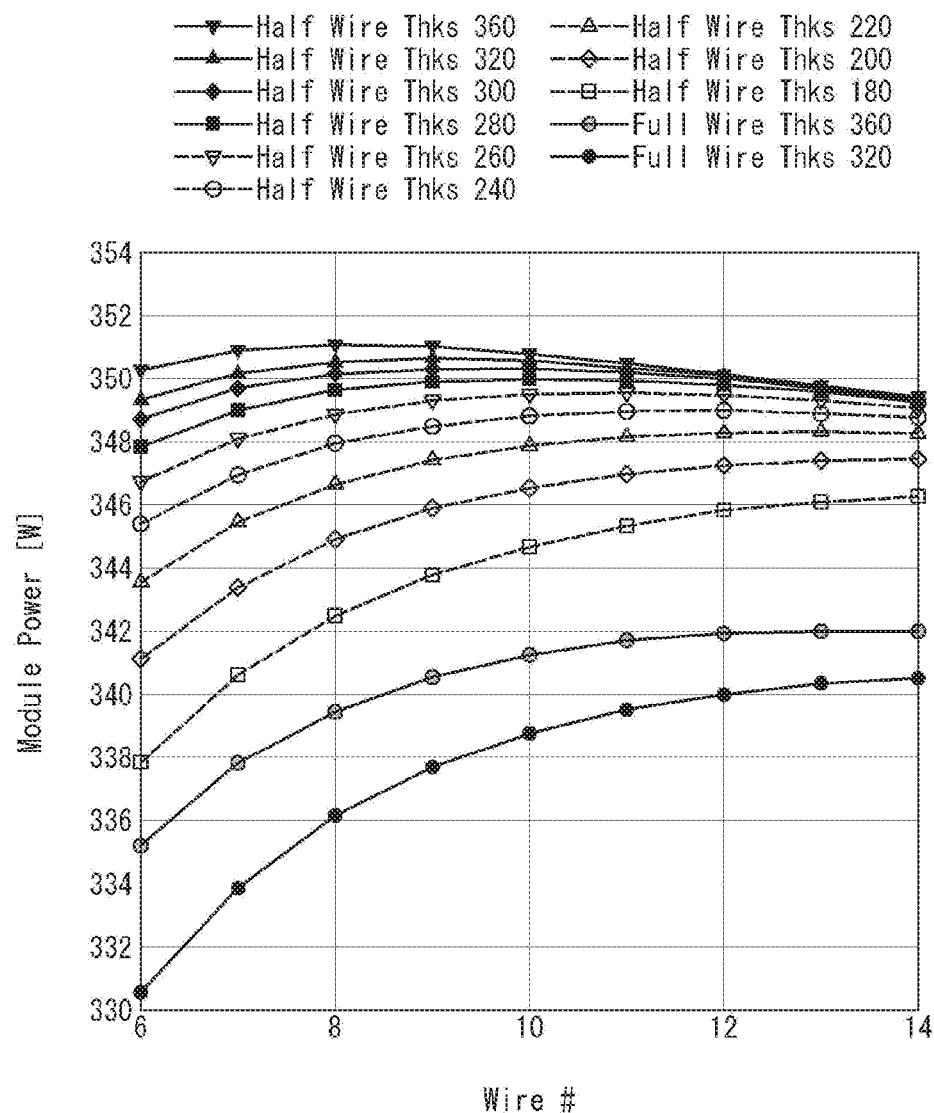

FIGS. 9 and 10 are graphs showing output and efficiency of a module depending on a thickness of a wiring member. In FIG. 9 and FIG. 10, experimental examples (half wire thks 360~half wire thks 180) compose a solar cell module using unit solar cells formed by dividing a mother solar cell into two, and comparative examples (full wire thks 320~half wire thks 240) compose a solar cell module using a mother solar cell. In the experimental examples, unit solar cells 6*20 are connected in series, and in the comparative examples, mother solar cells 6*10 are connected in series. In FIG. 9, the solar cells of the experimental examples and the mother solar cells of the comparative examples are disposed 2.5 mm apart from neighboring strings in each string, in FIG. 10, being disposed 1.0 (mm) apart, so that it can be seen not only the output comparison between the comparative example and the experimental example, but also how the output varies depending on the disposition distance G of the solar cell. In FIG. 9 and FIG. 10, the thickness of the wiring member means the thickness of the core layer.

First, in FIG. 9, it can be seen that the module output of the experiment examples (half wire thks 360~half wire thks 180) is greater than that of the comparative examples (full wire thks 320~half wire thks 240). Here, the module output (P) is a value obtained by Equation 1 below, and means a value obtained by multiplying a voltage (V) and a current (I)

produced by the solar cell module. In embodiments of the invention, thks refers to thickness $$P = VI \text{ (W)} \quad \text{[Equation 1]}$$

As can be seen through FIGS. 9 and 10, it can be seen that the experimental examples have a larger module output than the comparative examples regardless of the thickness of the wiring member, and it can be seen that the thicker the wiring member, the more the module output increases in both the experimental examples and the comparative examples.

In comparison, in the case of the comparative examples, the module output increases as the number of wiring members increases, but it can be seen that at some point, that is, the number of wiring members converges to a constant value from 12, and this phenomenon can be similarly confirmed in the experimental examples. When the number of wiring members is larger than 12, it can be seen that the module output is not greatly improved in consideration of the error range. In addition, since the output is reduced by about twice at a point where the number of wiring members is 8 or less (between 6 and 8) than at a point where the number of wiring members is 8 or more (between 8 and 10) based on a point where the number of wiring members is 8, it can be seen that this point (the number of wiring members is 8) is an inflection point.

Considering these, the number of wiring members in the present disclosure is for example 8 or more, 12 or less, but the present disclosure is not limited thereto, and the number of wiring members can be 6 to 24 in consideration of various variable conditions in manufacturing.

In addition, when the thickness of the wiring member is 255 to 265 μm or approximately thereabout (half wire thks 260 in the drawing), it can be acknowledged that the module output that is evenly distributed regardless of the number of wiring members compared to other experimental examples. Therefore, when the thickness of the wiring member, more precisely, the thickness D1 of the core layer is composed of 255 to 265 μm or approximately thereabout, it is possible to manufacture a solar cell module with no deviation within the error range.

Hereinafter, look at the module output change of the experimental examples. The experimental examples of FIG. 9 show the module output when the disposition distance of the unit solar cells is 2.5 (mm), and the experimental examples of FIG. 10 show the module output when the disposition distance of the unit solar cells is 1.0 (mm). Comparing FIG. 9 and FIG. 10, it can be seen that the module output of the experimental examples of FIG. 10 is reduced by about 2.4 (W) as a whole than the module output of the experimental examples of FIG. 9. This reduction in power means a reduction in power of less than about 1%, based on module output 350 (W).

On the other hand, it can be seen that the experimental examples of FIG. 10 is higher than the experimental examples of FIG. 9 in the module efficiency. Here, the module output (P) refers to absolute output produced by the module, and the module efficiency (Q) refers to relative output produced per unit area (S). The module efficiency is defined as in Equation 2 below.

$$Q = P/S \text{ (W/mm}^2\text{)} \quad \text{[Equation 2]}$$

When a module is composed with a disposition distance of 2.5 (mm) in the unit solar cell, an area of the module is 1,740 (mm)*1,016 (mm)=1,767,840 (mm$^2$), and when a module is composed with a disposition distance of 1.0 (mm) in the unit solar cell, an area of the module is 1,686*1,016 (mm)=1,712,976 (mm$^2$).

Therefore, it can be seen that the module efficiency of the experimental examples of FIG. 10 is about 2 to 3% higher than the module efficiency of the experimental examples of FIG. 9. As described above, when comparing the experimental example and the comparative example, when the solar cell disposition distance is reduced, the module output can slightly decrease, but the module efficiency increases by more than the decrease of the module output, so that overall module efficiency can be increased.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module, comprising:
   a plurality of solar cells each having a rectangular shape including a long axis and a short axis, and including a first electrode disposed on a front surface of a substrate and a second electrode disposed on a back surface of the substrate, the plurality of solar cells being disposed along a first direction; and
   a plurality of wiring members connected to the first electrode of a first solar cell and the second electrode of a second solar cell adjacent to the first solar cell among the plurality of solar cells,
   wherein the plurality of wiring members include a core layer of metal, and a solder layer which surrounds a surface of the core layer and is formed of a solder material,
   wherein a ratio D2/D1 of a thickness D2 of the solder layer to a thickness D1 of the core layer is approximately 0.05<D2/D1<0.08,
   wherein the number of the plurality of wiring members is about 8 to 12,
   wherein a distance between the first solar cell and the second solar cell is approximately 0.5 mm to 1.5 mm,
   wherein a length of the short axis is approximately a half a length of the long axis,
   wherein a thickness of the plurality of wiring members is approximately 270 μm to 320 μm,
   wherein the plurality of wiring members each is a wire-shape,
   wherein each of the plurality of solar cells is a fragment divided from a mother solar cell,
   wherein the each of the plurality of solar cells includes a cut surface and a non-cut surface in the first direction, and
   wherein neighboring two solar cells among the plurality of solar cells are disposed with the cut surface of one of the neighboring two solar cells and the non-cut surface of the other of the neighboring two solar cells facing each other in the first direction, wherein the non-cut surface includes an inclined side, and the cut surface lacks the inclined side, and wherein the inclined side faces the cut surface in the first direction.

2. The solar cell module of claim 1, wherein the thickness D1 of the core layer is approximately 240 to 280 μm.

3. The solar cell module of claim 2, wherein the thickness D1 of the core layer is approximately 255 to 265 μm.

4. The solar cell module of claim 2, wherein the thickness D2 of the solder layer is approximately 15 μm to 20 μm.

5. The solar cell module of claim 1, wherein a cross section of at least one of the plurality of wiring members has a polyhedral shape having at least a curved surface or at least three vertices.

6. The solar cell module of claim 1, wherein the distance between the first solar cell and the second solar cell is approximately 1 mm.

* * * * *